United States Patent
Schroedinger

(10) Patent No.: US 6,950,482 B2
(45) Date of Patent: Sep. 27, 2005

(54) PHASE DETECTOR CIRCUIT FOR A PHASE CONTROL LOOP

(75) Inventor: Karl Schroedinger, Berlin (DE)

(73) Assignee: Infineon Technologies AG, Munich (DE)

( * ) Notice: Subject to any disclaimer, the term of this patent is extended or adjusted under 35 U.S.C. 154(b) by 864 days.

(21) Appl. No.: 10/001,173

(22) Filed: Nov. 2, 2001

(65) Prior Publication Data

US 2003/0002601 A1 Jan. 2, 2003

(30) Foreign Application Priority Data

Jun. 29, 2001 (DE) .......................................... 101 32 232

(51) Int. Cl.⁷ .......................... H03D 1/00; H04L 27/06
(52) U.S. Cl. ........................ 375/340; 375/375; 375/376; 375/373
(58) Field of Search ................................. 375/340, 355, 375/376; 327/312; 455/260

(56) References Cited

U.S. PATENT DOCUMENTS

| | | | | |
|---|---|---|---|---|
| 4,086,539 A | * | 4/1978 | Gustafson et al. | 327/156 |
| 4,535,459 A | | 8/1985 | Hogge, Jr. | |
| 5,034,748 A | * | 7/1991 | Goedeke et al. | 342/99 |
| 5,315,269 A | * | 5/1994 | Fujii | 331/1 A |
| 5,471,502 A | * | 11/1995 | Ishizeki | 375/376 |
| 5,477,177 A | * | 12/1995 | Wong et al. | 327/156 |
| 5,606,731 A | * | 2/1997 | Pace et al. | 455/260 |
| 5,953,386 A | * | 9/1999 | Anderson | 375/376 |
| 5,956,379 A | * | 9/1999 | Tarleton | 375/376 |
| 6,194,917 B1 | | 2/2001 | Deng | |
| 2001/0006343 A1 | * | 7/2001 | Yoshizawa | 324/76.77 |
| 2001/0031028 A1 | * | 10/2001 | Vaucher | 375/355 |
| 2002/0061086 A1 | * | 5/2002 | Adachi et al. | 375/376 |

FOREIGN PATENT DOCUMENTS

| DE | 32 00 491 C2 | 11/1982 |
|---|---|---|
| EP | 0 716 501 M1 | 6/1996 |

OTHER PUBLICATIONS

Charles R. Hogge, Jr.: "A Self Correcting Clock Recovery Circuit", Journal of Lightwave Technology, vol. LT–3, No. 6, Dec. 1985, pp. 1312–1314.

* cited by examiner

Primary Examiner—Stephen Chin
Assistant Examiner—Harry Vartanian
(74) Attorney, Agent, or Firm—Laurence A. Greenberg; Werner H. Stemer; Ralph E. Locher

(57) ABSTRACT

A phase detector circuit for a phase control loop includes two EXOR circuits and an integrating loop filter which are connected to form one circuit. The two EXOR circuits have common load resistors or current sources. The output signals from the EXOR circuits are integrated through the use of two integrators, which are respectively connected in parallel with the common load resistors or current sources. The voltage across the two integrators provides the output voltage of the loop filter. This eliminates the need for an additional differential amplifier and integrator. The phase detector has a low current consumption and can be produced with a simplified circuit technique.

8 Claims, 5 Drawing Sheets

PHASE DETECTOR CIRCUIT FOR A PHASE CONTROL LOOP

BACKGROUND OF THE INVENTION

FIELD OF THE INVENTION

The invention relates to a phase detector circuit for a phase control loop and in particular to a phase detector circuit for a phase locked loop (PLL) circuit or a delay locked loop (DLL) circuit.

Phase control loops are used for data regeneration in integrated circuits. The aim of data regeneration is to align a reference clock signal with respect to the data of a data signal and to use this reference clock signal to produce a regenerated data signal in which all the data bits have the same pulse width and the same amplitude and in which any jitter is reduced.

It is common practice to realize phase control loops using phase locked loop (PLL) circuits. A PLL circuit has a voltage controlled oscillator (VCO) which provides a desired reference clock signal on the basis of a filtered signal from a phase comparator. A PLL phase locked loop is described by Charles R. Hogge, Jr. in the article with the title "A Self Correcting Clock Recovery Circuit," Journal of Lightwave Technology, Vol. LT-3, No. 6, December 1985, pages 1312 ff. and also in U.S. Pat. No. 4,535,459. A PLL phase control loop of this type is schematically shown in FIG. 4.

The phase control loop shown in FIG. 4 has two D-type flip-flop circuits 1, 2, two EXOR components 3, 4, an input filter 5, an integrating loop filter (or phase comparator) 6 and a voltage controlled oscillator VCO 7. The input D of the first flip-flop circuit 1 receives data signals Din from a digital data signal, which is also applied to one input of the first EXOR component 3. A second input C of the first flip-flop 1 receives a reference clock signal produced by the oscillator 7.

A non-inverted output Q of the first flip-flop 1 is connected to one input of the first EXOR component 3, to one input of the second EXOR component 2 and to a data input D of the second flip-flop 2. The second input C of the second flip-flop 2 in turn has the clock signal from the oscillator 7 applied to it. An non-inverted output Q of the second flip-flop 2 is coupled to the other input of the second EXOR component 4 and, also, is the data output D2 of the phase control loop, at which output the regenerated data signal D2 is produced.

The logic signals E1, E2 produced at the outputs of the EXOR components 3, 4 are subjected, after initial filtering in the input filter 5, to difference formation and subsequent integration in the integrating loop filter 6. In this context, the integrating loop filter 6 is frequently realized by using a charge pump and a downstream-connected low pass filter. The charge pump essentially integrates the output signal from the EXOR components 3, 4.

The output value from the loop filter 6, which is a DC value L, is then supplied to the oscillator 7, which adjusts the phase of the reference clock signal it produces on the basis of the DC value applied. The output of the oscillator 7 is supplied to the inputs C of the flip-flops 1, 2. For the precise configuration and the precise manner of operation of the circuit, reference is made to U.S. Pat. No. 4,535,459.

Examples of known embodiments of an EXOR circuit 3, 4 are shown in FIGS. 5 and 6. A phase detector circuit and EXOR circuits according to the prior art are explained with reference to FIGS. 4 to 6. In this case, A, An and B, Bn denote the differential inputs of the EXOR circuit. In accordance with FIG. 5, an EXOR circuit has transistors T1, ... T7 and also two resistors R1, R2, from which an output voltage is tapped at the reference points Q, Qn. The transistor T1 used as current source sets the current in the circuit, and this current determines the output level on the resistors R1, R2. The configuration of the transistors provides an EXOR (exclusive OR) function. The circuit is based on the customary CML (Collector Mode Logic) technique. The reference voltages are indicated as Vdd and Vss.

In FIG. 6, unlike in FIG. 5, no current source determining the output level on the resistors R1, R2 is provided. The resulting current is determined through the use of the resistors R1, R2 and the respective residual resistances of the transistors T2 to T7.

In the known EXOR circuits in FIGS. 5, 6, it is necessary to control the differential inputs A, An, B, Bn using appropriate voltages in order to obtain the desired currents in R1, R2. Thus, at high frequencies, there is no longer any firm or fixed impression of currents. The circuits shown normally have a voltage output and need to have an accordingly low impedance at the reference points Q, Qn, i.e. the current needs to be at a correspondingly high level. This is problematic for high data rates, at which the current consumption should be reduced as far as possible.

A drawback of the known circuit shown in FIG. 4 is that fast EXOR components and also subsequent filters, differential amplifiers and integrators are required. Particularly the EXOR components require considerable power losses at high data rates for these reasons. In general, radio-frequency circuits using CMOS (complementary metal-oxide semiconductor) or bipolar technology, which are operated at the upper frequency limit, have a considerable current consumption. The circuit in FIG. 4 therefore needs to be simplified and needs to have a reduced current requirement.

As an alternative to phase control loops using a PLL circuit, phase control loops using a delay locked loop (DLL) circuit are also known. A delay locked loop (DLL) circuit requires no voltage controlled oscillator and produces an output signal which has a predetermined delay with respect to an input reference signal. However, the problems mentioned with respect to PLL circuits arise in this case, too, because phase comparators and integrating loop filters are likewise used. A DLL circuit is described in U.S. Pat. No. 5,614,855, for example.

SUMMARY OF THE INVENTION

It is accordingly an object of the invention to provide a phase detector circuit for a phase control loop which overcomes the above-mentioned disadvantages of the heretofore-known circuits of this general type and which has a low current consumption and can be produced using a simplified circuit technique.

With the foregoing and other objects in view there is provided, in accordance with the invention, a phase detector circuit for a phase control loop, including:

an input connection for receiving input data;

a data regeneration circuit operatively connected to the input connection, the data regeneration circuit regenerating the input data in dependence of a clock signal;

two EXOR circuits connected to the data regeneration circuit, the EXOR circuits operating as phase comparators;

an integrating loop filter connected to the two EXOR circuits such that the two EXOR circuits and the integrating loop filter are connected to form one circuit, the integrating loop filter integrating a difference between signals provided by the two EXOR circuits and the integrating loop filter providing an output signal controlling a generation of the clock signal fed back to the data regeneration circuit;

the two EXOR circuits having common circuit elements which are load resistors or current sources;

two integrators respectively connected in parallel to the common circuit elements, the two integrators integrating output signals provided by the two EXOR circuits; and the integrating loop filter providing, as the output signal, a voltage resulting at the two integrators.

In other words, according to the invention, the EXOR circuits and the integrating loop filter of a phase detector circuit are connected to form one circuit. This is done such that, firstly, the two EXOR circuits have common load resistors or current sources, and, secondly, the output signals from the EXOR circuits are integrated using two integrators which are respectively connected in parallel with the common load resistors or current sources. In this case, the voltage across the two integrators is the output voltage of the loop filter.

The basic principle of the circuit according to the invention is that it is not the voltages, which are evaluated on the load resistors or current sources. This is because, for this case, it would be necessary for the load resistors or current sources to be a low-impedance configuration, and a considerable current consumption would therefore be necessary, which is exactly what needs to be prevented. Instead, according to the invention, the currents from the transistors in the EXOR circuits are evaluated, which means that the circuit can be given a much higher impedance. Accordingly, the load resistors or current sources are preferably a high-impedance configuration.

The fact that the two EXOR circuits have common load resistors or current sources means that a difference is automatically formed between the signals of the two EXOR circuits. A separate differential amplifier is thus obviated. In addition, the configuration of the integrators in accordance with the invention, which are directly linked to the EXOR circuits, makes it possible to eliminate the use of a separate integrator or of a separate charge pump.

According to another feature of the invention, the common circuit elements are high-impedance elements such that the common circuit elements, in conjunction with the integrators, provide an integrating action.

According to yet another feature of the invention, the integrators each include a series circuit and a capacitance provided in parallel to the series circuit, the series circuit includes a resistor and a further capacitance.

In accordance with a preferred embodiment of the invention, the two EXOR circuits have common current sources, and the current flowing through the current sources is set by a mirror circuit.

According to another embodiment of the invention, the two EXOR circuits have common load resistors, the current flowing through the load resistors being set by a current source transistor.

A data regeneration circuit preferably includes two D-type flip-flop circuits which each have a data input and a clock input and are coupled to the EXOR circuits. In this case, the regenerated data are produced at the uninverted output of the second D-type flip-flop circuit.

According to a preferred feature of the invention, the phase detector is used for a phase locked loop circuit or a delay locked loop circuit.

Other features which are considered as characteristic for the invention are set forth in the appended claims.

Although the invention is illustrated and described herein as embodied in a phase detector circuit for a phase control loop, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1A:
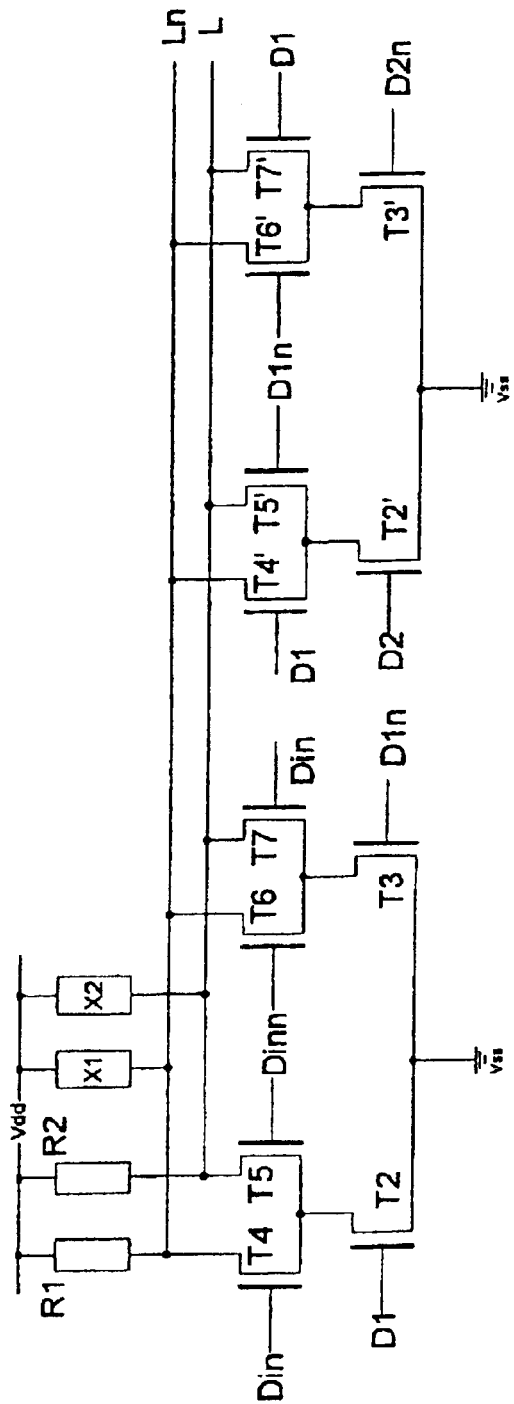
FIG. 1A is a circuit diagram of a first exemplary embodiment of a phase detector circuit according to the invention.
Figure 4:
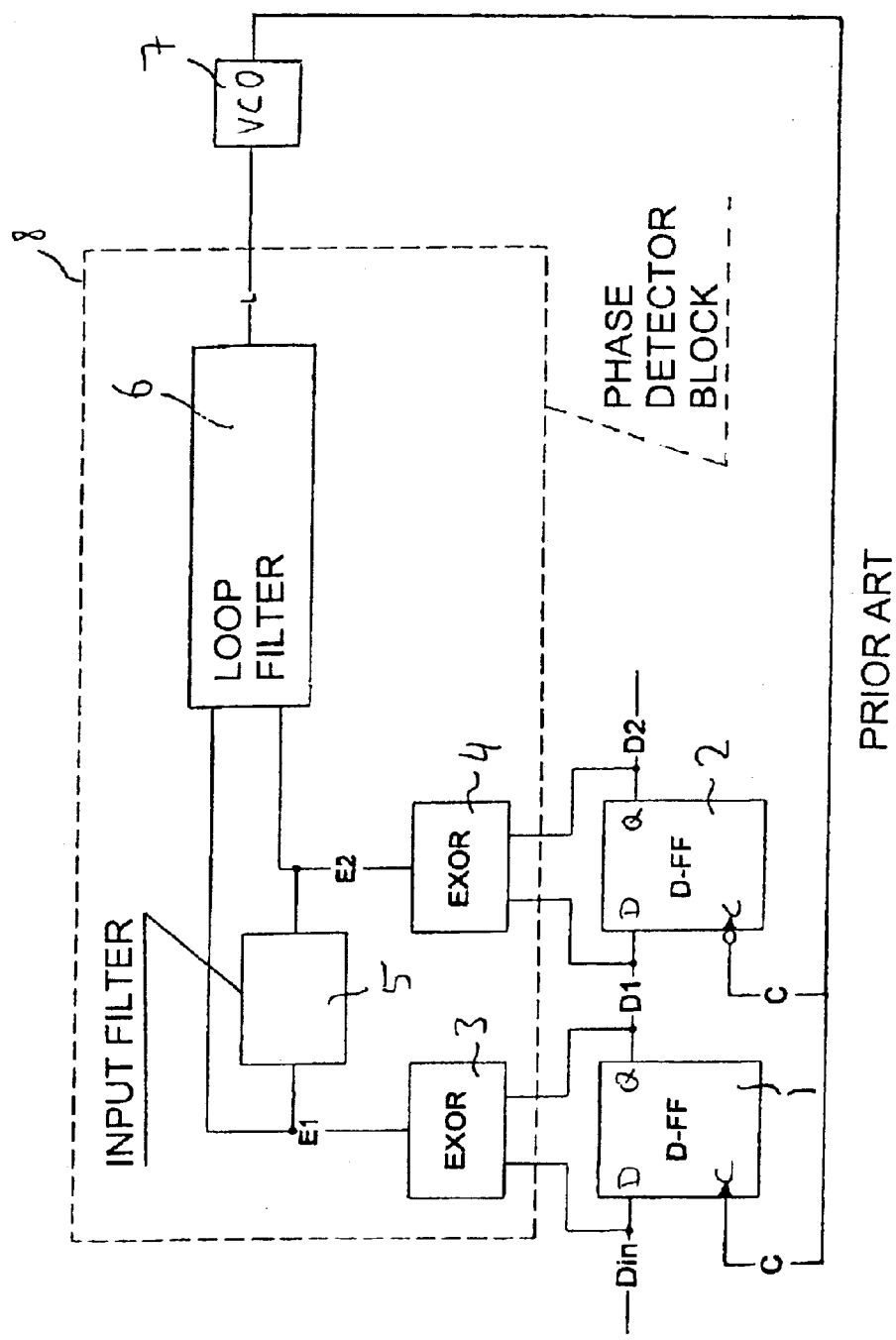
FIG. 4 is a block diagram of a phase detector circuit according to the prior art.
Figure 6:
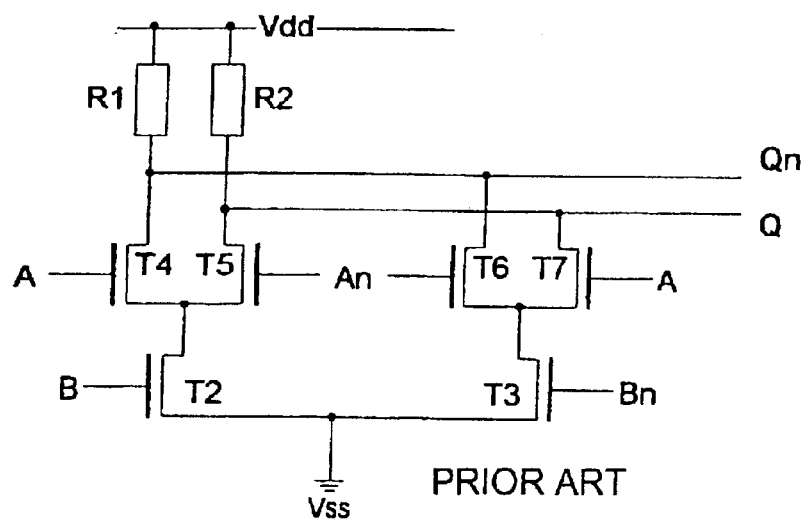
FIG. 6 is a circuit diagram of a second exemplary embodiment of an EXOR circuit according to the prior art.

Referring now to the figures of the drawings in detail and first, particularly, to FIG. 1A thereof, there is shown a circuit according to the invention whose functionality corresponds to the functionality of block 8 in FIG. 4. Accordingly, two EXOR circuits whose configuration corresponds to the circuits in FIG. 6 and which include transistors T2, . . . , T7 and T2', . . . , T7' are connected together such that a respective common load resistor R1, R2 is connected to the top outputs of the transistors T4, T5 and T4', T5'.

In this case, the transistors T2, . . . , T7 and T2', . . . , T7' have the signals Din, Dinn, D1, D1n, D2, D2n according to FIG. 4 applied to them, as is shown. In this case, the index "n" (n=negated) represents the respectively inverted signals. In this regard, it should be pointed out that the figures show only one signal (cf. FIG. 4). In actual fact, differential signals are preferably involved in each case. This has the advantage of a lower signal-to-noise ratio and is customary for fast circuits.

Figure 1B:
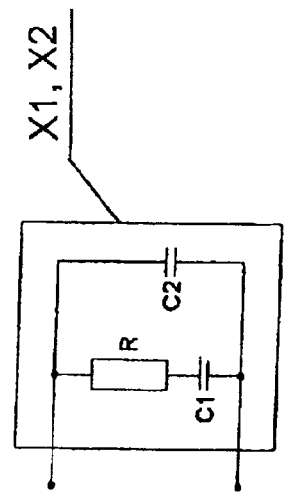
FIG. 1B is a circuit diagram of a preferred embodiment of the integrator of the circuit shown in FIG. 1A.

Provided in parallel with the load resistors R1, R2 is a respective integrator X1, X2 which, in the exemplary embodiment as shown in FIGS. 1A and 1B, includes a resistor R and a capacitance C1 connected in series and a capacitance C2 provided in parallel with the series circuit, but which may also be of different configuration. The output voltage L, Ln of the circuit is tapped at the common reference points of resistor R1 and integrator X2, and, respectively, resistor R2 and integrator X2, and is supplied to a VCO or to a phase shifter which aligns a clock signal to the data signal under consideration in a manner which is known per se.

The use of a common resistor R1, R2 automatically forms a difference between the two EXOR circuits upon integration, since the respective output signals are superimposed at the resistors R1, R2 in each case. This allows to dispense with a separate differential amplifier.

According to the invention, the currents from the transistors T4 to T7 and, respectively, T4' to T7' are evaluated, which means that the circuit can be operated at very high impedances. This lowers the current consumption of the circuit considerably. For operating the circuit at high impedance, the resistors R1, R2 are of configured as high-impedance resistors and small currents are provided in T4 to T7 and, respectively, T4' to T7'. In this context, parasitic capacitances play no part on account of the integration carried out at the same time at the nodes L, Ln.

The load resistors R1, R2, which are configured as high-impedance resistors, have an integrating action in conjunction with the filter C1, C2, R or integrator X1, X2.

Figure 5:
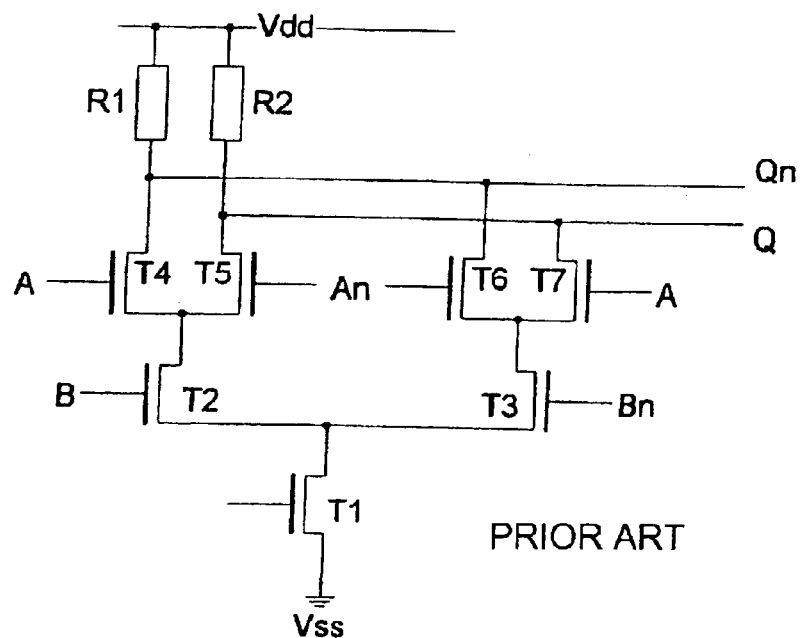
FIG. 5 is a circuit diagram of a first exemplary embodiment of an EXOR circuit according to the prior art.

Alternatively, in FIG. 1A it is also possible to use EXOR circuits according to FIG. 5 with an additional current source transistor T1. The configuration is otherwise identical, wherein in this embodiment the current can easily be set using the current source transistor T1.

It should be pointed out that the transistors T2, ..., T7, T2', ..., T7' may be field effect transistors, in particular transistors of the CMOS type, or may be bipolar transistors.

Figure 2A:
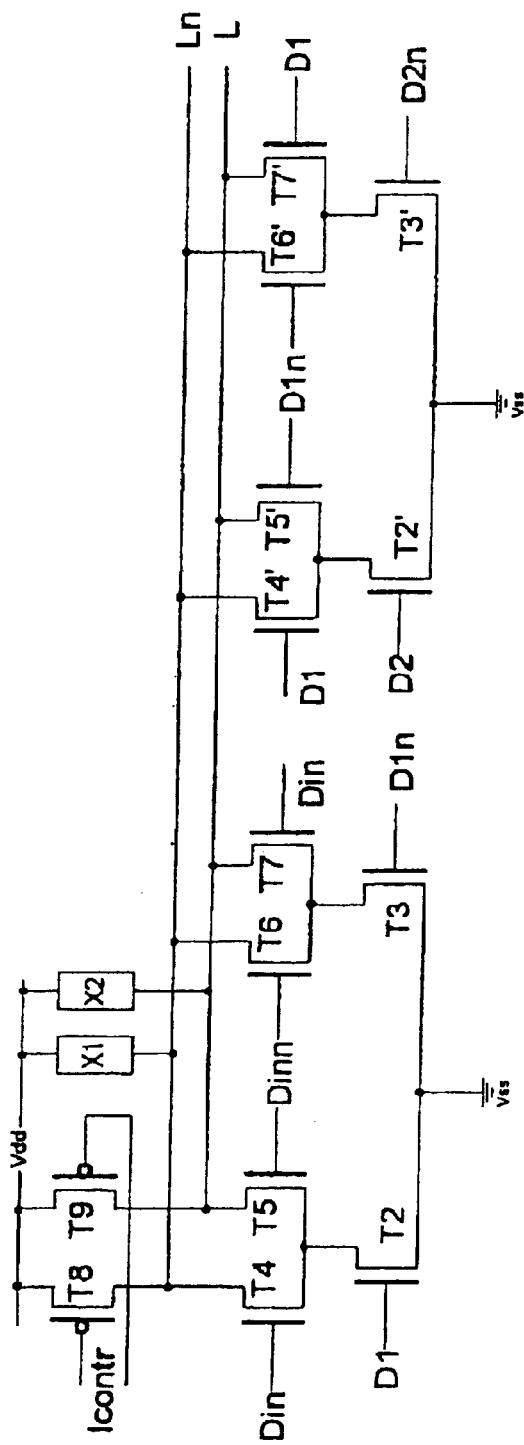
FIG. 2A is a circuit diagram of a second exemplary embodiment of a phase detector circuit according to the invention.
Figure 2B:
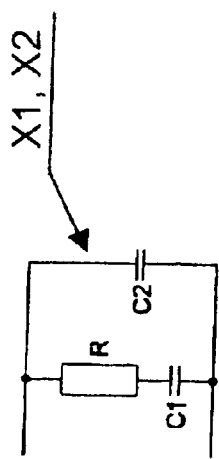
FIG. 2B is a circuit diagram of a preferred embodiment of the integrator of the circuit shown in FIG. 2A.

The exemplary embodiment in FIG. 2A differs from the exemplary embodiment in FIG. 1A to the extent that, instead of the resistors R1, R2, current sources T8, T9 act as the load, the current sources being controlled by the signal Icontr. The current sources T8, T9 are transistors in current source mode, i.e. they are configured as high-impedance elements. The use of current sources T8, T9 as the load makes it possible to increase the gain of the stage as compared with simple resistors.

Figure 3:
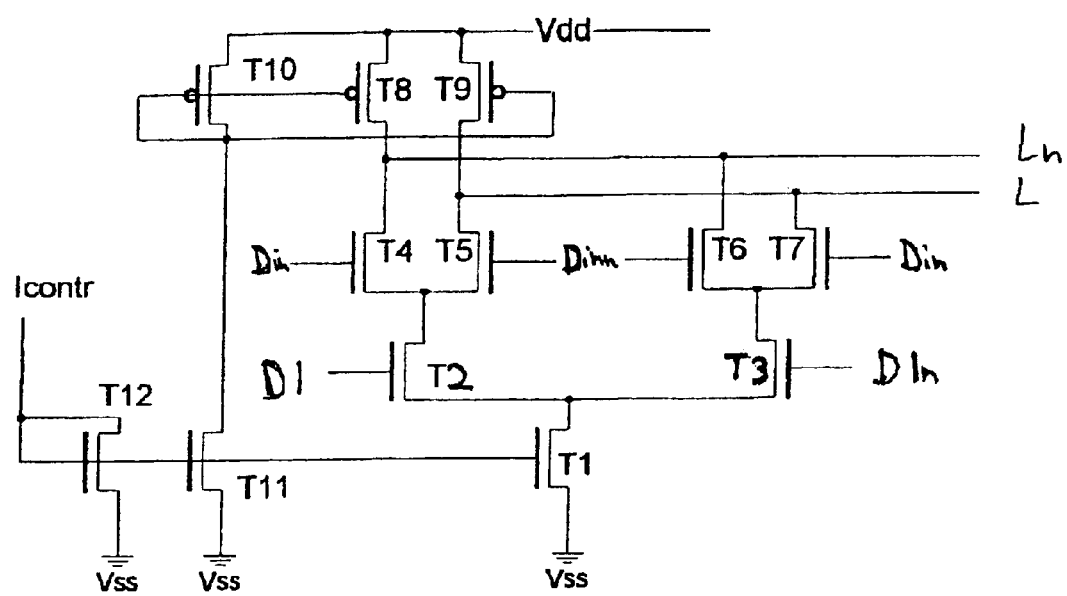
FIG. 3 is a circuit diagram of a third exemplary embodiment of a phase detector circuit according to the invention.

FIG. 3 shows an alternative embodiment in which transistors T10, T11 represent a current mirror for the current sources T8, T9, and the current mirror is used to set the current. In this case, the current in T8, T9 is equal to half the value of the current in T1.

I claim:

1. A phase detector circuit for a phase control loop, comprising:
    an input connection for receiving input data;
    a data regeneration circuit operatively connected to said input connection, said data regeneration circuit regenerating the input data in dependence of a clock signal;
    two EXOR circuits connected to said data regeneration circuit, said EXOR circuits operating as phase comparators;
    an integrating loop filter connected to said two EXOR circuits such that said two EXOR circuits and said integrating loop filter are connected to form one circuit, said integrating loop filter integrating a difference between signals provided by said two EXOR circuits and said integrating loop filter providing an output signal controlling a generation of the clock signal fed back to said data regeneration circuit;
    said two EXOR circuits having common circuit elements selected from the group consisting of load resistors and current sources;
    two integrators respectively connected in parallel to said common circuit elements, said two integrators integrating output signals provided by said two EXOR circuits; and
    said integrating loop filter providing, as the output signal, a voltage resulting at said two integrators.

2. The phase detector circuit according to claim 1, wherein said common circuit elements selected from the group consisting of the load resistors and the current sources are high-impedance elements such that said common circuit elements, in conjunction with said integrators, provide an integrating action.

3. The phase detector according to claim 1, wherein said integrators each include a series circuit and a capacitance provided in parallel to said series circuit, said series circuit includes a resistor and a further capacitance.

4. The phase detector according to claim 1, including:
    a current mirror circuit operatively connected to said common circuit elements; and
    said common circuit elements being embodied as said current sources, said current mirror circuit setting a current flowing through said current sources.

5. The phase detector according to claim 1, including:
    a current source transistor operatively connected to said common circuit elements; and
    said common circuit elements being embodied as said load resistors, said current source transistor setting a current flowing through said load resistors.

6. The phase detector according to claim 1, wherein said data regeneration circuit includes two D-flip-flop circuits connected to said two EXOR circuits, said two D-flip-flop circuits having respective data inputs and clock inputs.

7. In combination with a phase locked loop circuit, a phase detector circuit, comprising:
    an input connection for receiving input data;
    a data regeneration circuit operatively connected to said input connection, said data regeneration circuit regenerating the input data in dependence of a clock signal;
    two EXOR circuits connected to said data regeneration circuit, said EXOR circuits operating as phase comparators;
    an integrating loop filter connected to said two EXOR circuits such that said two EXOR circuits and said integrating loop filter are connected to form one circuit, said integrating loop filter integrating a difference between signals provided by said two EXOR circuits and said integrating loop filter providing an output signal controlling a generation of the clock signal fed back to said data regeneration circuit;
    said two EXOR circuits having common circuit elements selected from the group consisting of load resistors and current sources;
    two integrators respectively connected in parallel to said common circuit elements, said two integrators integrating output signals provided by said two EXOR circuits; and
    said integrating loop filter providing, as the output signal, a voltage resulting at said two integrators.

8. In combination with a delay locked loop circuit, a phase detector circuit, comprising:
    an input connection for receiving input data;
    a data regeneration circuit operatively connected to said input connection, said data regeneration circuit regenerating the input data in dependence of a clock signal;
    two EXOR circuits connected to said data regeneration circuit, said EXOR circuits operating as phase comparators;
    an integrating loop filter connected to said two EXOR circuits such that said two EXOR circuits and said integrating loop filter are connected to form one circuit, said integrating loop filter integrating a difference between signals provided by said two EXOR circuits and said integrating loop filter providing an output signal controlling a generation of the clock signal fed back to said data regeneration circuit;

said two EXOR circuits having common circuit elements selected from the group consisting of load resistors and current sources;

two integrators respectively connected in parallel to said common circuit elements, said two integrators integrating output signals provided by said two EXOR circuits; and said integrating loop filter providing, as the output signal, a voltage resulting at said two integrators.

* * * * *